(12) United States Patent
Umehara et al.

(10) Patent No.: US 12,003,227 B2
(45) Date of Patent: Jun. 4, 2024

(54) COMPOSITE SUBSTRATE, PIEZOELECTRIC DEVICE, AND METHOD FOR MANUFACTURING COMPOSITE SUBSTRATE

(71) Applicant: KYOCERA Corporation, Kyoto (JP)

(72) Inventors: Motohiro Umehara, Yasu (JP); Kuniaki Mitsuda, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 651 days.

(21) Appl. No.: 17/263,872

(22) PCT Filed: Jul. 29, 2019

(86) PCT No.: PCT/JP2019/029720
§ 371 (c)(1),
(2) Date: Jan. 27, 2021

(87) PCT Pub. No.: WO2020/027075
PCT Pub. Date: Feb. 6, 2020

(65) Prior Publication Data
US 2021/0320641 A1    Oct. 14, 2021

(30) Foreign Application Priority Data

Aug. 1, 2018    (JP) ................................. 2018-145112

(51) Int. Cl.
*H03H 9/02*    (2006.01)
*H03H 3/08*    (2006.01)
(Continued)

(52) U.S. Cl.
CPC .......... *H03H 9/02574* (2013.01); *H03H 3/08* (2013.01); *H03H 9/02559* (2013.01); *H10N 30/072* (2023.02); *H10N 30/10513* (2023.02)

(58) Field of Classification Search
CPC ...................... H03H 9/02574; H03H 9/02559
See application file for complete search history.

(56) References Cited

U.S. PATENT DOCUMENTS 9,613,849 B2    4/2017    Konishi et al.
2015/0102707 A1    4/2015    Hori et al.
(Continued)

FOREIGN PATENT DOCUMENTS

CN    104488080 B    6/2017
JP    2008-301066 A    12/2008
(Continued)

*Primary Examiner* — Derek J Rosenau
(74) *Attorney, Agent, or Firm* — Procopio, Cory, Hargreaves & Savitch LLP

(57) ABSTRACT

A composite substrate of the present disclosure is a composite substrate comprising a piezoelectric substrate and a sapphire substrate which are directly bonded, wherein the ratio of the number of oxygen atoms to the number of aluminum atoms in the bonding surface region including the bonding surface of the sapphire substrate bonded to the piezoelectric substrate is less than 1.5. The piezoelectric device of the present disclosure comprises the composite substrate. A method for manufacturing the composite substrate of the present disclosure comprises a step of preparing a piezoelectric substrate and a sapphire substrate, a step of heat-treating the sapphire substrate in a reducing atmosphere or in a vacuum, and a step of directly bonding the piezoelectric substrate to the sapphire substrate.

8 Claims, 2 Drawing Sheets

(51) Int. Cl.
    *H10N 30/00*     (2023.01)
    *H10N 30/072*     (2023.01)

(56) References Cited

U.S. PATENT DOCUMENTS

2015/0200129 A1    7/2015  Konishi et al.
2018/0166622 A1    6/2018  Akiyama et al.

FOREIGN PATENT DOCUMENTS

| | | |
|---|---|---|
| JP | 2014-195026 A | 10/2014 |
| JP | 2016-225538 A | 12/2016 |
| JP | 2017-200101 A | 11/2017 |

COMPOSITE SUBSTRATE, PIEZOELECTRIC DEVICE, AND METHOD FOR MANUFACTURING COMPOSITE SUBSTRATE

TECHNICAL FIELD

The present disclosure relates to a composite substrate having a structure in which a piezoelectric substrate and a support substrate are bonded, a piezoelectric device with the composite substrate, and a method for manufacturing the composite substrate.

BACKGROUND ART

In recent years, there has been a demand for miniaturization and higher performance of piezoelectric devices such as surface acoustic wave devices used in communication devices such as mobile phones. As a small and high performance piezoelectric device, it is suggested that a piezoelectric device has a structure in which an element electrode is formed on a piezoelectric substrate of a composite substrate where the piezoelectric substrate and a support substrate bonded together (Patent Documents 1 to 3).

The bonding methods of the composite substrate can be broadly classified into a method of bonding through an adhesive layer and a method of direct bonding by applying an activation treatment to the bonding surface. The direct bonding is superior in heat resistance, temperature characteristics, and the like to adhesion.

The piezoelectric substrate is composed of a piezoelectric material, such as lithium tantalate (LT). Various materials are used as the support substrate. Among them, sapphire has excellent mechanical strength, insulation, and heat dissipation, making it particularly suitable as the support substrate.

Patent Document 1 describes a composite substrate in which spurious (bulk wave reflection) at a bonding interface is reduced by implanting a hydrogen ion from the bonding surface of a piezoelectric substrate and/or a support substrate, disrupting crystallinity near the bonding surface, and then bonding the substrates. Patent Document 2 describes a composite substrate in which a peeling layer is formed by implanting a hydrogen ion from the bonding surface of a piezoelectric substrate and then bonding them together. Patent Document 3 describes a composite substrate in which a piezoelectric substrate suppressing a pyroelectric effect by a reducing treatment and a low thermal expansion support substrate are bonded.

PRIOR ART DOCUMENTS

Patent Documents

Patent Document 1: Japanese Unexamined Patent Publication No. 2017-200101
Patent Document 2: Japanese Unexamined Patent Publication No. 2016-225538
Patent Document 3: Japanese Unexamined Patent Publication No. 2008-301066

SUMMARY OF THE INVENTION

The composite substrate of the present disclosure is a composite substrate comprising a piezoelectric substrate and a sapphire substrate which are directly bonded to each other, wherein the ratio of the number of oxygen atoms to the number of aluminum atoms in the bonding surface region including the bonding surface of the sapphire substrate bonded to the piezoelectric substrate is less than 1.5. The piezoelectric device of the present disclosure comprises the composite substrate. A method for manufacturing the composite substrate of the present disclosure comprises a step of preparing a piezoelectric substrate and a sapphire substrate, a step of heat-treating the sapphire substrate in a reducing atmosphere or in a vacuum, and a step of directly bonding the piezoelectric substrate to the sapphire substrate.

EMBODIMENTS FOR CARRYING OUT THE INVENTION

The composite substrate and the piezoelectric device of the present disclosure are described as referring to the figures.

Composite Substrate and Piezoelectric Device

Figure 1:
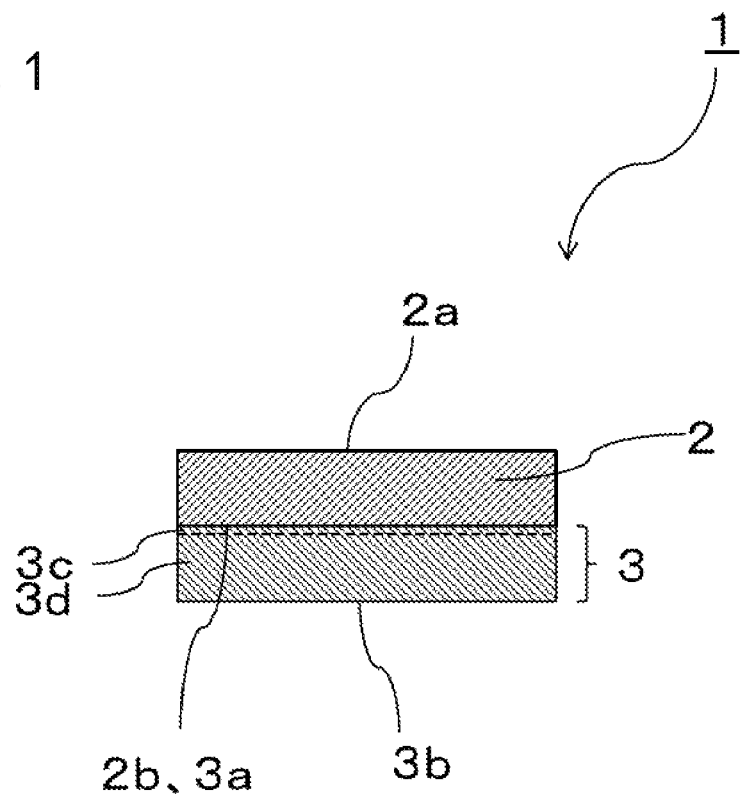
FIG. 1 is a schematic sectional view showing an example of the composite substrate of the present disclosure.

FIG. 1 shows a schematic sectional view of a composite substrate 1 of the present disclosure. The composite substrate 1 is a composite substrate in which a piezoelectric substrate 2 and a sapphire substrate 3 are directly bonded. In the bonding surface region 3c including the bonding surface 3a of the sapphire substrate 3 that is bonded to the piezoelectric substrate 2, the ratio of the number of oxygen atoms to the number of aluminum atoms is less than 1.5. The piezoelectric device of the present disclosure has a composite substrate 1. In the present disclosure, the bonding surface region 3c includes at least several atomic layers or more from the third surface 3a.

The composite substrate 1 of the present disclosure is described in detail below. The composite substrate 1 has the piezoelectric substrate 2 having a first surface 2a and a second surface 2b opposing each other, and a sapphire substrate 3 having a third surface 3a and a fourth surface 3b opposing each other. In the composite substrate 1, the second surface 2b of the piezoelectric substrate 2 and the third surface 3a of the sapphire substrate 3 are opposed to each other and are directly bonded to each other. The direct bonding means that the piezoelectric substrate 2 and the sapphire substrate 3 are bonded in direct contact with each other without adhesives or the like.

An element electrode is formed on the first surface 2a of the piezoelectric substrate 2 and is used as the composite substrate 1 for piezoelectric devices such as surface acoustic wave devices.

In the composite substrate 1, the first surface 2a is an element forming surface for an element electrode or the like, the second surface 2b and the third surface 3a are bonding surfaces, and the fourth surface 3b is a back side. The element forming surface is a part where a functional part such as the element electrode is located, as described above. The element electrode is, for example, interdigital electrodes that are positioned so as to engage with each other. The filtering for the signal or the like is performed by the surface acoustic wave between the interdigital electrodes.

Conventionally, a surface acoustic wave device with a composite substrate has a problem of generating noise called as a spurious at frequencies higher than the passband. The noise is caused by the reflection of bulk waves at the bonding interface between the piezoelectric substrate 2 and the sapphire substrate 3 (support substrate).

In the composite substrate 1 of the present disclosure, the ratio of the number of oxygen atoms to the number of aluminum atoms in the bonding surface region 3c of the sapphire substrate 3 is less than 1.5. That is, it lacks more oxygen than a stoichiometric composition. Due to this oxygen deficiency, the reflection of bulk waves can be reduced by the crystallinity irregularity of the bonding surface region 3c, without reducing the bonding strength between the piezoelectric substrate 2 and the sapphire substrate 3. If the ratio of the number of oxygen atoms to the number of aluminum atoms is less than 1.4, the effect of reflection reduction is particularly large. Therefore, it is advantageous with respect to noise suppression. The atomic number ratio of the sapphire substrate 3 can be measured by methods such as XPS (X-ray photoelectron spectroscopy).

The atomic number ratio of aluminum and oxygen in the bonding surface region 3c may be obtained, for example, by sputtering the sapphire substrate 3 from the third surface 3a or the fourth surface 3b, and measuring the atomic number ratio of aluminum and oxygen at multiple locations within 10 nm deep from the third surface 3a at predetermined measurement intervals, and then determining from the average. The measurement values at the outermost surface (0 nm in depth) are excluded from the average, because the error is large due to the effect of deposits or the like.

The piezoelectric substrate 2 is composed of a piezoelectric material such as lithium tantalate (LT), lithium niobate (LN), zinc oxide, and quartz crystal. The sapphire substrate 3 is a support substrate. Sapphire is superior in mechanical strength, insulation, and heat dissipation, and therefore is suitable as a support substrate.

When the bulk region 3d of the sapphire substrate 3 (a body part between the third surface 3a and the fourth surface 3b, excluding the region about 10 nm deep from the third surface 3a and the fourth surface 3b) is less oxygen deficiency, the strength of the sapphire substrate 3 is increased, and the composite substrate 1 and the piezoelectric device are less likely to be damaged. That is, the bulk region 3d may have no oxygen deficiency and the same atomic number ratio (O/Al=1.6) as the stoichiometry. Therefore, it is suitable if the ratio of the number of oxygen atoms to the number of aluminum atoms in the bonding surface region 3c of the sapphire substrate 3 is less than the ratio of the number of oxygen atoms to the number of aluminum atoms in the bulk region 3d of the sapphire substrate 3.

The first surface 2a of the piezoelectric substrate 2 can have good element characteristics, when the arithmetic average roughness Ra is 1 nm or less. When the fourth surface 3b of the sapphire substrate 3 has the arithmetic average roughness Ra of 1 μm or more, the reflection of bulk waves on the fourth surface 3b can be reduced. Therefore, it is effective with respect to improving the element characteristics.

Conventionally, a technique for reducing spuriousness by injecting hydrogen from the third surface 3a, disrupting the crystallinity of the bonding surface region 3c, and then bonding is known. However, the bonding strength between the piezoelectric substrate 2 and the sapphire substrate 3 is prone to decrease due to hydrogen injection. When the hydrogen concentration in the bonding surface region 3c is preferably $1 \times 10^{16}$ atoms/cm$^3$ or less, the bonding strength between the piezoelectric substrate 2 and the sapphire substrate 3 is increased. The hydrogen concentration in the bonding surface region 3c can be measured by a method such as SIMS (secondary ion mass spectrometry).

Method for Manufacturing Composite Substrate

Figure 2A:
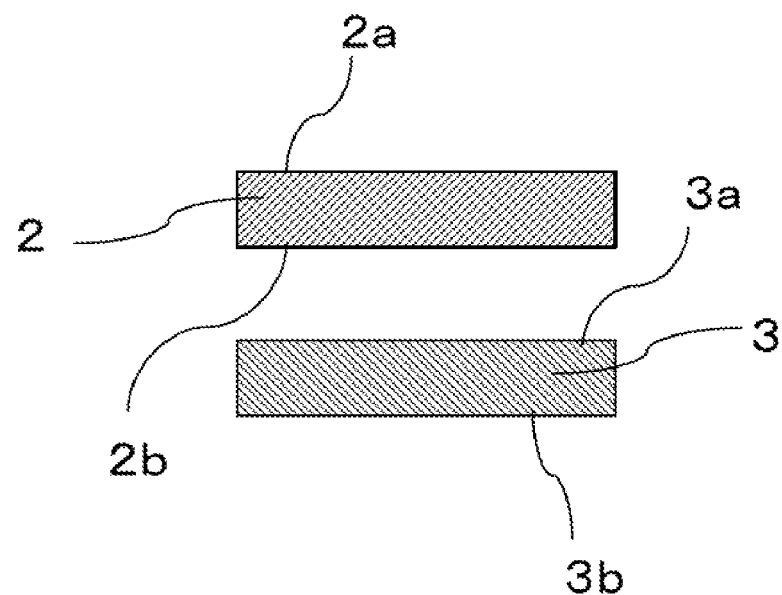
FIG. 2A is a schematic explanatory view of a method for manufacturing the composite substrate of the present disclosure.
Figure 2B:
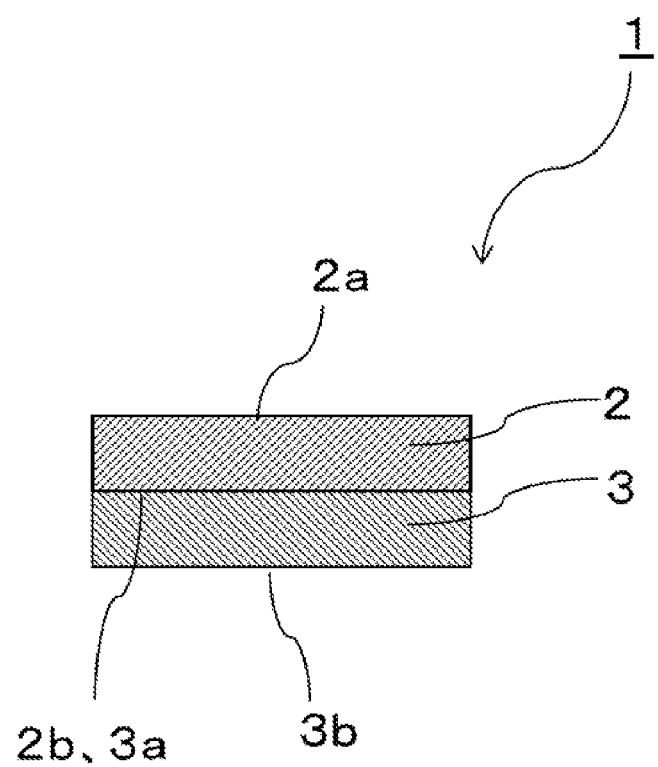
FIG. 2B is a schematic explanatory view of a method for manufacturing the composite substrate of the present disclosure.

FIGS. 2A and 2B show the schematic explanatory views of the method for manufacturing the composite substrate of the present disclosure. The method for manufacturing the composite substrate of the present disclosure comprises a step of preparing the piezoelectric substrate 2 and the sapphire substrate 3 (FIG. 2A), a step of heat-treating the sapphire substrate 3 in a reducing atmosphere or in a vacuum, and a step of directly bonding the piezoelectric substrate 2 and the sapphire substrate 3 (FIG. 2B).

Hereinafter, the details of the method for manufacturing the composite substrate of the present disclosure are explained. First, the piezoelectric substrate 2 having a first surface 2a and a second surface 2b opposing each other, and the sapphire substrate 3 having a third surface 3a and a fourth surface 3b opposing each other are prepared. The first surface 2a is the element forming surface, the second surface 2b and the third surface 3a are the bonding surfaces, and the fourth surface 3b is the back side.

The sapphire substrate 3 is prepared by cutting an ingot-shaped or ribbon-shaped sapphire single crystal grown by an appropriate growing method.

The second surface 2b of the piezoelectric substrate 2 and the third surface 3a of the sapphire substrate 3 are planarized using a lapping device or the like. When processing the second surface 2b and the third surface 3a to the arithmetic mean roughness Ra of 0.1 μm or less, good bonding strength can be obtained.

Next, at least the third surface 3a of the sapphire substrate 3 is heat-treated in a reducing atmosphere, such as a hydrogen atmosphere, or in a vacuum. For example, in the hydrogen atmosphere treatment, a treatment of 5 to 60 minutes at 950° C. to 1300° C. is suitable. This process introduces an oxygen deficiency in the bonding surface region 3c. Unlike the hydrogen injection, the hydrogen atmosphere treatment or the vacuum treatment can suppress the penetration of hydrogen into the bonding surface region 3c. Therefore, a reduction in the bonding strength of the bonding surface region 3c is unlikely to occur. The hydrogen concentration in the bonding surface region 3c is, for example, $1 \times 10^{16}$ atoms/cm$^3$ or less.

Next, at least one of the second surface 2b of the piezoelectric substrate 2 or the third surface 3a of the sapphire substrate 3 is activated by a method such as a plasma treatment.

The piezoelectric substrate 2 and the sapphire substrate 3 are bonded to each other by the direct bonding without using adhesive materials. In the direct bonding, the piezoelectric substrate 2 and the sapphire substrate 3 are bonded by heating and/or pressurizing them in vacuum, air or a predetermined atmosphere. By the previous activation process, the temperature at the time of bonding can be lowered. Therefore, the causes of damage and poor processing accuracy due to the difference in thermal expansion coefficient of the piezoelectric substrate 2 and the sapphire substrate 3 can be reduced.

In the direct bonding between the piezoelectric substrate 2 and the sapphire substrate 3, a diffusion bonding by the diffusion of atoms between the piezoelectric substrate 2 and the sapphire substrate 3 is used. If the sapphire substrate 3 has an oxygen deficiency in the bonding surface region 3c, the diffusion of atoms between the piezoelectric substrate 2 and the sapphire substrate 3 is accelerated by utilizing the oxygen deficiency, and the bonding strength is improved.

After bonding the piezoelectric substrate 2 and the sapphire substrate 3, the thickness of the sapphire substrate 3 may be thinned by the lapping process or the like. The thickness of the piezoelectric substrate 2 may be thinned by the lapping process or the like. It is suitable that the first surface 2a of the piezoelectric substrate 2 is processed so that the arithmetic mean roughness Ra is 1 nm or less by CMP processing or the like.

A hydrogen furnace and a vacuum furnace, which are used in the reducing atmosphere treatment and the vacuum treatment, are also excellent in that they are cheaper and simpler devices than an ion implanter or a plasma treatment apparatus. When the piezoelectric substrate 2 is heat-treated, the conductivity and composition of the piezoelectric substrate 2 change, and has a significant influence on the element characteristics. In contrast, the heat treatment conditions of the support substrate (sapphire substrate 3) can be expected to have a greater effect due to a larger allowable range of processing conditions.

As a method of introducing the oxygen deficiency into the sapphire substrate 3, an ingot-shaped or ribbon-shaped sapphire crystal may be grown in the reducing atmosphere, or the grown sapphire crystal may be heat-treated in the reducing atmosphere. That is, the introduction of the oxygen deficiency into the sapphire crystal for the sapphire substrate 3 may be performed, for example, for those grown in a non-reducing atmosphere (after growing). Thus, by cutting the sapphire crystal with the oxygen deficiency introduced and preparing the sapphire substrate 3, It is possible to obtain the sapphire substrate 3 in which the ratio of the number of oxygen atoms to the number of aluminum atoms is smaller than 1.5. The sapphire crystal can be grown by growing methods such as the CZ method, the EFG method, and the Bridgeman method.

Compared to the process of introducing the oxygen deficiency into the sapphire crystal, the process of introducing the oxygen deficiency into the sapphire substrate 3 has a greater effect on the process, because the amount of the oxygen deficiency in the bonding surface region 3c can be controlled by acting directly on the bonding surface region 3c.

According to the present disclosure, it is possible to provide the composite substrate and the piezoelectric device in which the bonding strength between the piezoelectric substrate and the support substrate is high and the reflection of bulk waves on the bonding surface is reduced.

Although the embodiments of the present disclosure have been described above, the present disclosure is not limited to the above-described embodiments, and various improvements and changes may be made within the scope of the claims. For example, it is possible to use the sapphire substrate 3 in which the ratio of the number of oxygen atoms to the number of aluminum atoms is less than 1.5, even on surfaces other than the bonding surface region 3c (the third surface 3a).

DESCRIPTION OF THE REFERENCE NUMERALS

1 Composite Substrate
2 Piezoelectric Substrate
2a First Surface (Element Forming Surface)
2b Second Surface (Bonding Surface of Piezoelectric Substrate)
3 Sapphire Substrate
3a Third Surface (Bonding Surface of Sapphire Substrate)
3b Fourth Surface (Back Side)
3c Bonding Surface Region
3d Bulk Region

The invention claimed is:

1. A composite substrate comprising a piezoelectric substrate and a sapphire substrate which are directly bonded to each other,
   wherein a ratio of a number of oxygen atoms to a number of aluminum atoms in a bonding surface region including a bonding surface of the sapphire substrate bonded to the piezoelectric substrate is less than 1.5.

2. A composite substrate according to claim 1, wherein the ratio of the number of oxygen atoms to the number of aluminum atoms in the bonding surface region of the sapphire substrate is less than a ratio of a number of oxygen atoms to a number of aluminum atoms in a bulk region of the sapphire substrate.

3. A composite substrate according to claim 1, wherein a hydrogen concentration in the bonding surface region of the sapphire substrate is $1 \times 10^{16}$ atoms/cm$^3$ or less.

4. A composite substrate according to claim 1, wherein the piezoelectric substrate comprises a piezoelectric material selected from lithium tantalate, lithium niobate, zinc oxide, and quartz crystal.

5. A piezoelectric device comprising the composite substrate according to claim 1.

6. A piezoelectric device according to claim 5, which is a surface acoustic wave device.

7. A method for manufacturing a composite substrate comprising a piezoelectric substrate and a sapphire substrate which are directly bonded to each other, comprising:
   preparing a piezoelectric substrate and a sapphire substrate,
   heat-treating the sapphire substrate in a reducing atmosphere or in a vacuum, and
   directly bonding the piezoelectric substrate and the sapphire substrate to each other, wherein a ratio of the number of oxygen atoms to the number of aluminum atoms in a bonding surface region including a bonding surface of the sapphire substrate bonded to the piezoelectric substrate is less than 1.5.

8. A method for manufacturing a composite substrate comprising a piezoelectric substrate and a sapphire substrate which are directly bonded to each other, comprising:
   preparing a piezoelectric substrate,
   growing or heat-treating a sapphire crystal in a reducing atmosphere,
   preparing a sapphire substrate by cutting the sapphire crystal, and
   directly bonding the piezoelectric substrate and the sapphire substrate to each other, wherein a ratio of the number of oxygen atoms to the number of aluminum atoms in a bonding surface region including a bonding surface of the sapphire substrate bonded to the piezoelectric substrate is less than 1.5.

* * * * *